United States Patent [19]
Iyer et al.

[11] Patent Number: 5,840,215
[45] Date of Patent: Nov. 24, 1998

[54] ANISOTROPIC CONDUCTIVE ADHESIVE COMPOSITIONS

[75] Inventors: Shridhar R. Iyer, Sugar Land; Pui Kwan Wong, Houston, both of Tex.

[73] Assignee: Shell Oil Company, Houston, Tex.

[21] Appl. No.: 768,055

[22] Filed: Dec. 16, 1996

[51] Int. Cl.$^6$ .............. H01B 1/22; B32B 35/00; B32B 31/00
[52] U.S. Cl. .............. 252/500; 252/512; 252/514; 156/60; 156/94; 156/247; 156/327
[58] Field of Search .............. 252/512, 514, 252/500; 524/439, 779, 781; 156/47, 60, 94, 247, 322, 327; 525/471, 502; 528/405, 425, 310

[56] References Cited

U.S. PATENT DOCUMENTS

| | | | |
|---|---|---|---|
| 3,979,373 | 9/1976 | Kiovsky et al. | 526/12 |
| 4,113,981 | 9/1978 | Fujita et al. | |
| 4,826,932 | 5/1989 | Wong | 525/539 |
| 5,120,665 | 6/1992 | Tsukagoshi et al. | 437/8 |
| 5,120,678 | 6/1992 | Moore et al. | 437/183 |
| 5,274,913 | 1/1994 | Grebe et al. | 29/840 |
| 5,288,769 | 2/1994 | Papageorge et al. | 523/200 |
| 5,292,688 | 3/1994 | Hsiao et al. | 437/209 |
| 5,371,328 | 12/1994 | Gutierrez et al. | 174/1 |
| 5,374,701 | 12/1994 | Hay et al. | 526/285 |
| 5,390,082 | 2/1995 | Chase et al. | 361/783 |
| 5,457,149 | 10/1995 | Hall et al. | 25/523 |
| 5,641,856 | 6/1997 | Meurs | 528/310 |

FOREIGN PATENT DOCUMENTS

| | | |
|---|---|---|
| 2282148 | 12/1976 | France . |
| 96/15159 | 5/1996 | WIPO . |

OTHER PUBLICATIONS

Search Report dated 17/Apr./1998.

"Cleavable Epoxy Resins: Design for Disassembly of a Thermoset," by S. L. Buchwalter and L.L. Kosbar, *Journal of PolymerScience: Part A: Polymer Chemistry*, vol. 34, pp. 249–260 (1996). (No Month).

*Primary Examiner*—Mark Kopec

[57] ABSTRACT

A novel thermally reworkable anisotropic conductive adhesive composition for attaching a semiconductor device to a substrate is provided. The composition comprises (a) a thermally reworkable crosslinked resin produced by reacting at least one dienophile having a functionality greater than one and at least one 2,5-dialkyl substituted furan-containing polymer, and (b) at least one electrically conductive material present in an effective amount to provide a conducting medium in only one direction.

31 Claims, No Drawings

ANISOTROPIC CONDUCTIVE ADHESIVE COMPOSITIONS

FIELD OF INVENTION

This invention relates to an adhesive composition. In one aspect, the invention relates to anisotropic conductive adhesive compositions suitable for attaching semiconductor devices and other components to carrier substrates.

BACKGROUND OF THE INVENTION

Anisotropic conductive adhesives are finding increasing use in electronic applications. Anisotropic conductive adhesives are adhesives that are comprised of electrically conductive particles at a concentration below that of an isotropic material. The concentration is controlled such that the adhesive is conductive in one direction only and is an electrical insulator in the transverse direction. U.S. Pat. No. 4,113,981 describes the art of using conductive particles to make such an adhesive. The conductive particles are usually spherical or substantially spherical in shape and can be metal particles made of metals such as silver, nickel and gold, or they can be plated insulating materials such as coated polymer powder or glass beads. The particle size distribution and volume content of the particles is tightly controlled to achieve electrical conductivity in only one direction.

Anisotropic conductive adhesives are used in a variety of electronic applications; the adhesion of flexible printed circuit boards to rigid printed circuit board substrates, tape automated bonding integrated circuits to glass or liquid crystal displays, and flip chip on various substrates such as glass panels and glass fiber-reinforced epoxy printed circuit boards. For instance, a conventional flip chip package typically consists of a bare semiconductor device that is solder-bumped on the conductive pads on its surface, turned upside down to face the substrate that has corresponding conductive pads with solder; the solder on the substrate is flowed to form an electrically conductive bond between the pads on the device and the substrate; and finally an encapsulant (insulating) is flowed between the two to protect the device against the environment and improve fatigue life performance. If an anisotropic conductive adhesive is used, it circumvents the practice of solder bumping the device, an expensive step in the flip chip manufacturing process. The conductive particles in the adhesive make the electrically conductive connection between the pads on the device and the substrate while preserving its insulating properties in the transverse direction.

Rework and repair of thermosetting anisotropic conductive adhesives in packages such as flip chips is destructive and difficult since the device needs to be sheared from the substrate, and the substrate cleaned before a replacement device is placed on the substrate. It is therefore desirable to produce an anisotropic conductive adhesive composition that allows the reworking to be more readily processable.

SUMMARY OF THE INVENTION

According to the invention, a thermally reworkable anisotropic conductive adhesive composition is provided comprising:
  (a) a thermally reworkable crosslinked resin produced by reacting at least one dienophile having a functionality greater than one and at least one 2,5-dialkyl substituted furan-containing polymer, and
  (b) at least one electrically conductive material present in an effective amount to provide a conducting medium in only one direction.

Such an anisotropic conductive adhesive composition provides a readily reworkable package.

DETAILED DESCRIPTION OF THE INVENTION

There may be several ways by which the polymer chains of the thermally reworkable crosslinked resin can be produced. The thermally reworkable crosslinked resin can be produced by reacting at least one dienophile having a functionality greater than one and at least one 2,5-dialkyl substituted furan-containing polymer connecting to one another via Diels-Alder addition. In one embodiment the 2,5-dialkyl substituted furan groups are attached to or form part of the polymer chains.

The reversible furan to dienophile reaction to form the Diels-Alder adduct can be represented by:

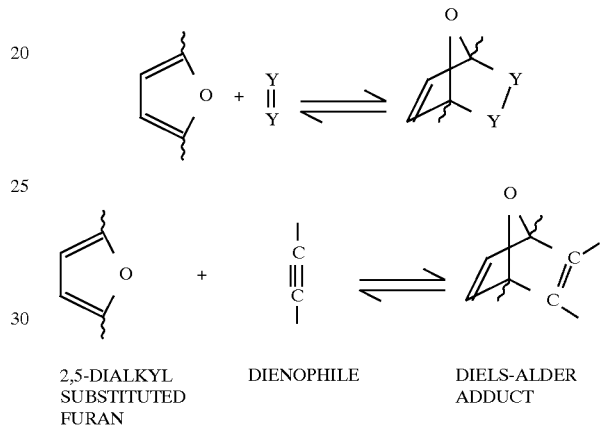

| 2,5-DIALKYL SUBSTITUTED FURAN | DIENOPHILE | DIELS-ALDER ADDUCT | where Y is either C< or N—.

For a thermally reworkable crosslinked resin, all or a portion of the Diels-Alder adduct can revert to the furan and dienophile upon heating such that the resin is a liquid (flowable material).

A crosslinking agent which contains in its molecular structure two or more dienophiles can also be used in this embodiment. These dienophiles are connected to each other by chemical bonds or by bridging groups. Accordingly, the present invention also contemplates an anisotropic conductive adhesive composition containing a polymer which comprises moieties of a 2,5-dialkyl substituted furan and a crosslinking agent which comprises two or more dienophiles in its molecular structure. The dienophiles may also be attached to or form part of the polymer chains. A crosslinking agent which comprises in its molecular structure two or more 2,5-dialkyl substituted furan groups can also be used.

In yet another embodiment the dienophile is attached to the polymer chains to which the 2,5-dialkyl substituted furan groups are also attached or which contain the 2,5-dialkyl substituted furan groups as a part of their polymer chains. Accordingly, the 2,5-dialkyl substituted furan-containing polymer can also contain moieties of a 2,5-dialkyl substituted furan and moieties of a dienophile.

The 2,5-dialkyl substituted furans may or may not be substituted at their 3- and 4-positions. Preferred substituents are inert substituents such as for example alkyl or alkyloxy groups, typically having up to 10 carbon atoms, such as methyl, ethyl, 1-propyl, methoxy and 1-hexyloxy groups. Resins containing furans whose 2 and 5 positions are not substituted are susceptible to side reactions which can cause irreversible gelling and interfere with its reversibility.

The 2,5-dialkyl substituted furan groups may be attached to the polymer chains of the polymer(s) on which the crosslinked resin is based. They may be attached thereto directly via a chemical bond or via a divalent organic bridging group for which any of the substituents of the furans or the 3- or 4-positions of the furans may function as the point of attachment. The alkyl substituents at the 2- and 5-positions of the furans may be the same or different and will typically have up to 10 carbon atoms. Examples of suitable alkyl groups are methyl, ethyl, 2-propyl and 1-hexyl groups. Examples of suitable furyl groups which can be attached to a polymer chain are 2,5-dimethylfur-3-yl, 2,5-diethyl-3-methyl-fur4-yl, 5-ethylfurfuryl or 5-(1-butyl) furfuryl groups.

The type of polymer chains to which the 2,5-dialkyl substituted furan groups may be attached is not critical. Suitably the polymer chains are chains of a polyolefin, such as polyethene, polypropene, polystyrene, poly(acrylic acid) or a copolymer of ethene and acrylic acid or ester, chains of random or alternating copolymers of carbon monoxide and olefinically unsaturated compounds (for a further elaboration on such copolymers cf. hereinafter), or chains which contain heteroatoms, such as chains of polyamide or polyester. It is preferred that the 2,5-dialkyl substituted furans form a structural element of the polymer backbone itself. In such a case it is particularly preferred that each of the 2,5-dialkyl substituents of the furans are alkylene groups which also form part of the polymer chain and which may or may not be substituted.

Such a structure can be produced by furanizing copolymers of carbon monoxide and olefinically unsaturated compounds which contain 1,4-dicarbonyl entities in their polymer chains, i.e. by converting such 1,4-dicarbonyl entities into furan moieties. Alternatively, a 2,5-dialkyl substituted furan-containing polymer can be directly produced by reacting carbon monoxide and olefinically unsaturated compounds in the presence of a strong acid.

Perfectly alternating copolymers of carbon monoxide and olefinically unsaturated compounds which contain 1,4-dicarbonyl entities in their polymer chains are known. They can be prepared by palladium catalyzed polymerization using the methods known from, for example, EP-A-121965, EP-A-181014 and EP-A-516238. The polymers so prepared are alternating copolymers of carbon monoxide and the olefinically unsaturated compounds, i.e. copolymers of which the polymer chains contain the monomer units originating in carbon monoxide (i.e. carbonyl groups) and the monomer units originating in the olefinically unsaturated compounds in an alternating arrangement so that every fourth carbon atom of the polymer chain belongs to a carbonyl group. Alternative copolymers of carbon monoxide and olefinically unsaturated compounds which contain 1,4-dicarbonyl entities may be random copolymers, i.e. copolymers of which the polymer chains contain monomer units in a random order. The latter copolymers can be prepared by radical initiated polymerization using the methods known from, e.g., U.S. Pat. No. 2,495,286 and U.S. Pat. No. 4024326.

The furanization of the copolymer of carbon monoxide and olefinically unsaturated compounds may be effected by methods known in the art, for example, by applying phosphorus pentoxide as dehydrating agent, as disclosed by A. Sen et al. (J. Polym. Science, Part A. Polym. Chem. 32 (1994) p. 841), or by heating in the presence of a strong acid, such as p-toluenesulphonic acid, as disclosed in U.S. Pat. No. 3979373. These methods allow the conversion of 1,4-dicarbonyl moieties in the polymer chains into furan moieties at a variable conversion level, depending upon the reaction conditions selected.

It is preferred to employ in the furanization an alternating copolymer of carbon monoxide and olefinically unsaturated compounds because these have a higher content of 1,4-dicarbonyl groups in the polymer back-bone so that the furanization can be accomplished efficiently at a high level of incorporation of furan groups. If, nevertheless, a low degree of furanization is desired, the conversion of carbonyl groups into furan groups may be kept low.

The copolymers of carbon monoxide and olefinically unsaturated compounds may be based on hydrocarbons as the olefinically unsaturated compounds. It is preferred that the copolymer is based on an olefinically unsaturated hydrocarbon, suitably an (α-olefin, in particular an α-olefin having up to 10 carbon atoms. Very suitable are aliphatic α-olefins, in particular those having from 3 to 6 carbon atoms and more in particular those having a straight carbon chain, such as propene, 1-butene, 1-pentene and 1-hexene. Propene is most preferred. The copolymer can be regioregular or irregular, stereoregular or atactic.

A 2,5-dialkyl substituted furan-containing polymer where a polymer based on propene and carbon monoxide are furanized can be represented by the formula:

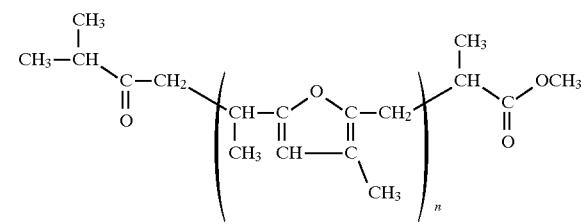

The precise nature of the dienophile from which the Diels-Alder adduct is obtained is not critical, as long as the Diels-Alder adduct has such a thermal stability that the crosslinked resin is reworkable. Usually the minimum temperature above which the reworkable crosslinked resin will be reworked depends on the maximum temperature requirements for the semiconductor device used. The reworking is suitably carried out at a temperature from about 100° C., preferably from about 130 ° C., to about 250° C., preferably to about 200° C.

Suitable dienophile functionality can be represented by Y=Y where Y is either C< or N—, or —C≡C—. Preferably the dienophiles are, for example, alkynes having electron withdrawing groups attached to both sides of the ethyne moiety, such as ester and keto groups. Examples are mono- and diesters of butynedioic acid (i.e. acetylenedicarboxylic acid) and substituted but-2-yne-1,4-diones. Other suitable dienophiles are compounds which contain a but-2-ene-1,4-dione moiety included in a 5- or 6-membered ring, in particular compounds of the general formula:

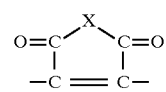

wherein X denotes O, S, N—, P— or —R— where R is alkylene, wherein at least one of the free valencies is occupied by a bridging group which connects the dienophile with one of the polymer chains or with another dienophile, and wherein the remaining valencies, if any, are occupied by lower alkyl or acyl substituents or, preferably, hydrogen. The lower alkyl substituents suitably contain up to 4 carbon atoms and are, for example, methyl or ethyl groups. Dienophiles of this general formula are preferably cyclic derivatives of maleic anhydride and, in particular, maleimide (i.e. X denotes O or, in particular, N—).

Examples of other suitable dienophiles include, bis(triazolinediones), bis(phthalazinediones), quinones, bis(tricyanoethylenes), bis(azodicarboxylates); diacrylates, maleate or fumarate polyesters, acetylenedicarboxylate polyesters.

As indicated hereinbefore, in one embodiment use is made of a crosslinking agent which comprises in its molecular structure two or more dienophiles from which the Diels-Alder adducts are obtainable. The dienophiles may be connected to each other by one or more bridging groups. For example, three dienophiles may be connected to one another by a trivalent bridging group. However, it is sufficient that a crosslinking agent is used in which two dienophiles are connected to one another by a bivalent bridging group. The dienophiles may also be connected to one another by chemical bonds.

Both the molecular weight and the chemical nature of the bridging group of the crosslinking agent may be varied to a large extent. It has been found that such variations of the crosslinking agent lead to re-moldable crosslinked resins covering a wide range of mechanical properties. The bridging group may contain only carbon atoms in the bridge but it is also possible that it contains heteroatoms in the bridge, such as oxygen, silicon or nitrogen atoms. The bridging group may be flexible or rigid.

For example, polymeric bridging groups having flexible polymer chains, such as poly(alkylene oxide) or polysiloxanes, having a number average molecular weight of, say, more than 300, provide rubbery reworkable crosslinked resins. When the polymeric flexible chain has a number average molecular weight in the order of 1500–5000 or more, reworkable crosslinked resins may be obtained which could replace thermoplastic rubbers.

Accordingly, suitable crosslinking agents of this kind are the bis-maleimido-capped poly(alkylene oxide)s, such as poly(ethylene oxide)s or poly(propylene oxide)s, and bismaleimido-capped polysiloxanes, for example the bismaleimides of polysiloxanes of the general formula $H_2N—CH_2[—O—SiR_2]_n—O—CH_2—NH_2$, wherein n is an integer, on average, of more than 10 and in particular in the range of 20–70, and each R is independently an alkyl group, in particular having up to 5 carbon atoms, preferably a methyl group. Very good results can be obtained with the bismaleimide of bisamino capped poly(propene oxide), in particular having a number average molecular weight of at least 300, more in particular in the range of 1500–5000.

Low-molecular weight bridging groups, i.e. bridging groups which typically have up to 20 carbon atoms in the bridge, may also be used. Cycloaliphatic and aromatic bridging groups render the bridging groups rigid. Low-molecular weight cycloaliphatic and aromatic bridging groups tend to provide re-moldable crosslinked resins which are hard and brittle, and have a relatively high glass transition temperature. Examples of cycloaliphatic and aromatic low-molecular weight bridging groups are groups containing a norbornane skeleton in the bridge, 1,3-phenylene groups and groups of the following formulae: —f—$CH_2$—f—, —f—O—f—O—f—, —f—O—f—$SO_2$—f—O—f— and —f—$C(CH_3)_2$—f—, wherein —f— denotes a 1,4-phenylene group. Other suitable bridging groups are alkylene and oxycarbonyl (ester) groups and combinations thereof. Suitable low-molecular weight crosslinking agents are, for example, the bismaleimides of hydrazine, 2,4-diaminotoluene, hexamethylenediamine, dodecamethylenediamine, diamines of the general formula:

and bisamino-capped (poly)siloxanes of low molecular weight, such as polysiloxanes of the general formula $H_2N—CH_2[—O—SiR_2]_n—O—CH_2—NH_2$, wherein n ranges, on average, from 1 to 10, preferably from 1 to 5 and the groups R are preferably methyl groups. An isomer mixture of the diamines of above formula is commercially available from HOECHST. Very good results can be obtained with bis(4-maleimidophenyl)methane and dimethylbis[(N-maleimidomethyl)oxy]silane.

Other suitable crosslinking agents on the basis of maleic anhydride are compounds of the general formula:

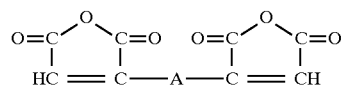

wherein A denotes a bridging group as described hereinbefore, in particular bridging group having up to 20 carbon atoms in the bridge. More in particular the bridging group A is an alkylene group, such as a hexamethylene group, or groups —D—O—CO— or —CO—O—D—O—CO— wherein D denotes a bivalent hydrocarbyl group, for example an alkylene group, such as a hexamethylene group.

Again other suitable crosslinking agents are polyesters based on butynedioic acid and a diol, such as ethylene glycol, a poly(ethylene glycol), propylene glycol or a poly(propylene glycol). These polyesters may be low molecular weight crosslinking agents, such as described hereinbefore, or they may have a number average molecular weight of, for example, more than 400, such as in the range of 2000–6000.

The present invention also relates to crosslinking agents such as bismaleimido-capped poly(alkylene oxide)s, in particular bismaleimido-capped poly(propene oxide)s. Such agents have a number average molecular weight of at least 300, preferably in the range of 1500–5000. The bismaleimides of polysiloxanes have the general formula $H_2N—CH_2[—O—SiR_2]_n—O—CH_2—NH_2$, wherein n is an integer of at least 1 and each R is independently an alkyl group, in particular having up to 5 carbon atoms, preferably a methyl group. The bismaleimido-capped polysiloxanes can be prepared by N-hydroxymethylation of maleimide with formaldehyde and subsequent reaction with the appropriate dichlorodialkylsilane in the presence of base and water using generally known methods.

As noted above, certain embodiments relate to a crosslinking agent which comprises in its molecular structure 2,5-dialkylfuran moieties. In this crosslinking agent the 2,5-dialkyl substituted furan groups can be connected to one another via a chemical bond or via a bridging group. The nature of this bridging group is generally the same as the bridging group of the crosslinking agents which comprise two or more dienophiles, as described hereinbefore. Examples of suitable crosslinking agents are bis(5-ethylfurfuryl) adipate and the bis-amides of (5-ethylfurfuryl) acetic acid and the diamines mentioned in the preceding paragraphs.

The 2,5-dialkyl substituted furan moieties and/or moieties of a dienophile may be connected to the polymer chains by means of a chemical bond or by means of a bridging group. This bridging group may be of the same type as the bridging groups of the crosslinking agents. Examples may be given as follows. When the polymer is a polystyrene, maleimide, as the dienophile, may be attached thereto by tin(IV)chloride catalyzed alkylation of the polystyrene with N-chloromethylmaleimide, and when the polymer is a (styrene/maleic anhydride)copolymer a 5-ethylfurfuryl group may be attached thereto by esterifying the (styrene/maleic anhydride)copolymer with 5-ethylfurfuryl alcohol in pyridine. When the polymer is a copolymer of carbon monoxide and olefinically unsaturated compounds which comprises 1,4-dicarbonyl entities in their polymer chains, 2,5-dialkylfurans and dienophiles may be attached thereto by reacting the copolymer with an appropriately substituted primary hydrocarbylamine, e.g., using the methods known from U.S. Pat. No. 3979374. In this reaction 1,4-dicarbonyl entities are converted into pyrrole entities which form part of the polymer chain and which are N-substituted with the substituted hydrocarbyl group. For example, a copolymer of carbon monoxide and olefinically unsaturated compounds which comprise 1,4-dicarbonyl entities may be reacted with the mono-amide of maleic acid and hexamethylenediamine or with the mono-amide of maleic acid and bis(4-aminophenyl)methane, followed by ring closure of the acid-amido moieties to maleimide moieties. This will yield a polymer having N-(6-maleimidohexyl)pyrrole or N-{4-[(4'-maleimidophenyl)methyl]phenyl}pyrrole entities in the polymer chain. When it is desired to use a polymer which contains 2,5-dialkyl substituted furan moieties and moieties of a dienophile a portion of the 1,4-dicarbonyl entities of a copolymer of carbon monoxide and olefinically unsaturated compounds may be converted into furan moieties and another portion of the 1,4-dicarbonyl entities may be converted into N-substituted pyrrole entities, of which the N-substituent comprise a dienophile.

The molecular weight of the polymer(s) on which the reworkable crosslinked resin is/are based may vary between wide limits. Suitably the polymer(s) have a number average molecular weight within the range of at least 500, preferably 700, to about 30,000, preferably to about 20,000.

The quantity of Diels-Alder adducts present in the thermally reworkable crosslinked resin depends on the quantity of 2,5-dialkyl furan groups and the quantity of the dienophile present in the composition from which the Diels-Alder adducts are formed. One skilled in the art will appreciate that a certain minimum quantity of Diels-Alder adducts is needed to be present to effect that the crosslinked resin is a solid material below the temperature at which the Diels-Alder adducts reverse to the 2,5-dialkyl substituted furan and the dienophile. It will also be appreciated that this minimum quantity depends on the molecular weight and the type of the polymer on which the resin is based and, if any crosslinking agent is used, on the number of dienophiles or 2,5-dialkyl furan groups per molecule (i.e. functionality) of the crosslinking agent. Lower molecular weights of the polymer will require a higher quantity of Diels-Alder adducts. The number of a Diels-Alder adducts may be lower when a crosslinking agent is used which has a higher functionality.

Generally good results can be achieved by using the 2,5-dialkyl furan-containing polymer having a furan groups to ketone groups ratio of from about 1:16 to about 4:1. The molar ratio of the 2,5-dialkyl substituted furan groups to dienophiles amounts typically from about 10:1 to about 1:5, preferably from about 5:1 to about 1:3.

CONDUCTIVE MATERIAL

In order to impart electrical conductivity in one direction, the anisotropic conductive adhesive contains electrically conductive materials (conductive particles). The conductive particles are substantially spherical although other forms such as flakes may also be used as a component in the adhesive. U.S. Pat. No. 4,113,981 describes the art of using conductive particles to make such an adhesive, which is hereby incorporated by reference. The conductive particles may be metal such as silver, nickel and gold, or may be metal-coated inert particles such as glass beads or polymer spheres. It is desirable to use a controlled particle size distribution of spherical particles where the particles have a narrow range of particle sizes in an effective amount to provide a conducting medium in only one direction. The electrically conductive particles are present in an amount effective to provide a conducting medium. A preferred amount of electrically conductive particles is less than or equal to about 60% by volume of the total thermally reworkable anisotropic conductive adhesive composition, preferably from about 5 to about 40%, although lesser and greater quantities can be used.

ANISOTROPIC CONDUCTIVE ADHESIVES

Thermally reworkable anisotropic conductive adhesive means that the semiconductor device or other such component can be removed from a substrate by liquefying the anisotropic conductive adhesive composition by heating. The anisotropic conductive adhesive composition is liquefied when the composition is flowable. The component can be removed without shearing or use of excessive force.

The thermally reworkable anisotropic conductive adhesive composition of the invention contains (a) a thermally reworkable crosslinked resin produced by reacting a dienophile having a functionality greater than one and a 2,5-dialkyl substituted furan-containing polymer, and (b) at least one electrically conductive material present in an effective amount to provide a conducting medium. The thermally reworkable anisotropic conductive adhesive composition can be worked and/or reworked at a temperature where the anisotropic conductive adhesive composition melts or liquefies. Typically, the thermally reworkable anisotropic conductive adhesive can be worked and/or reworked at a temperature within the range from about 100° C., preferably from about 130° C., to about 250° C., preferably to about 200° C. If the composition is heated for an extended period of time at high temperature, for instance, for 12 hours at 200° C., the composition undergoes irreversible crosslinking and it is no longer thermally reworkable.

The thermally reworkable anisotropic conductive adhesive composition can also contain other additives such as ion scavengers (e.g., tricalcium phosphate), free radical inhibitors (e.g., hydroquinone, phenothiazine), elastomeric modifiers (e.g., silicones), and other conventional additives used in anisotropic conductive adhesives. For a longer reworking time, it is preferable to use ion scavengers and/or free radical inhibitors.

The component is attached to a substrate using the thermally reworkable crosslinked resin by the steps comprising:
(a) providing the substrate;
(b) dispensing on a portion of the substrate a thermally reworkable anisotropic conductive adhesive composition comprising
  (i) a thermally reworkable crosslinked resin produced by reacting at least one dienophile having a functionality of greater than one and at least one 2,5-dialkyl substituted furan-containing polymer, and
  (ii) up to about 60% by volume of the anisotropic conductive adhesive composition of at least one electrically conductive material, at a temperature which is sufficiently high to convert the anisotropic conductive adhesive composition into a liquid thereby producing an adhesive-attached substrate, and (c) attaching the component (first surface containing the conductive pads) on the surface of the thermally reworkable anisotropic conductive adhesive composition dispensed on the substrate while the adhesive is a liquid under conditions effective to provide electrically conductive paths between the conductive pads on the component and the substrate while maintaining an electrically insulating property in the transverse direction, thereby bonding the component to the substrate, and providing an assembly. U.S. Pat. No. 4,113,981 which is hereby incorporated by reference, describes providing electrically conductive paths between the conductive pads on the component and the substrate while maintaining an electrically insulating property in the transverse direction of an adhesive. The component can be placed on the adhesive prior to substantial cooling by time or by heating to maintain or to reliquefy the adhesive to be a flowable material. The anisotropic conductive adhesive composition can be dispensed on the substrate by using standard equipment such as a syringe or a motionless mixer that mixes the components of the anisotropic conductive adhesive composition and precisely dispenses the composition on the substrate.

Components such as semiconductor devices and tape automated bonding integrated circuits can be bonded to various substrates. For example, semiconductor devices can be bonded to metal, ceramic or laminate substrates. Repair and rework of defective devices are becoming increasingly important. Multichip modules (MCM) use existing package technology with the only difference being that a number of bare chips are adhesively attached to a substrate and packaged together. As spacing between the attached component and nearby components such as other semiconductor devices gets closer, repair and rework without damage to adjacent components becomes extremely difficult. A thermally reworkable anisotropic conductive adhesive of this invention enables the user to perform repair and rework with ease on closely spaced components and high density substrates.

The thermally reworkable anisotropic conductive adhesive composition bonded between a component and a substrate can be reworked by steps comprising (a) heating the anisotropic conductive adhesive composition comprising
  (i) a thermally reworkable crosslinked resin produced by reacting a dienophile having a functionality greater than one and a 2,5-dialkyl substituted furan-containing polymer, and
  (ii) at least one thermally or electrically conductive material present in an effective amount up to about 60% by volume of the anisotropic conductive adhesive composition to provide an electrical conducting medium, at a temperature which is sufficiently high to convert the anisotropic conductive adhesive composition into a liquid thereby providing a liquid anisotropic conductive adhesive composition, (b) removing the component from the liquid anisotropic conductive adhesive composition;

(c) optionally, cleaning the substrate surface;

(d) optionally, dispensing a fresh thermally reworkable anisotropic conductive adhesive composition on a portion of the cleaned substrate surface, said anisotrpic conductive adhesive composition comprising
  (i) a thermally reworkable crosslinked resin produced by reacting a dienophile having a functionality greater than one and a 2,5-dialkyl substituted furan-containing polymer, and
  (ii) at least one electrically conductive material present in an effective amount up to about 60% by volume of the anisotropic conductive adhesive composition to provide a conducting medium in one direction, (e) optionally, providing another component on the surface of the liquid anisotropic conductive adhesive, thereby bonding another component on the anisotropic conductive adhesive; and (f) optionally, cooling the liquid anisotropic conductive adhesive to a temperature which is sufficiently low to solidify the resin.

The anisotropic conductive adhesive composition can be postbaked to enhance the anisotropic conductive adhesive thermal and mechanical properties (e.g., glass transition temperature and mechanical strength). In order to preserve the thermal reworkability of the crosslinked resin, the anisotropic conductive adhesive can be heated to a temperature within the range from about 70° C., preferably from about 90° C., to 200° C., preferably to about 160° C. for a period of time up to about 4 hours. If thermal reworkability is not required, the anisotropic conductive adhesive composition can be postbaked at a temperature within the range of from about 150° C., preferably from about 180° C., to about 300° C., preferably to about 250° C. for a period of time up to about 4 hours to improve the thermal properties.

ILLUSTRATIVE EMBODIMENT

The following illustrative embodiments describe the novel anisotropic conductive adhesive composition of the invention and are provided for illustrative purposes and are not meant as limiting the invention.

EXAMPLE 1

An autoclave was charged with methanol and propene (approximately 2:1 weight ratio), heated to 90° C., and then charged with carbon monoxide to a pressure of 72 bar. A catalyst solution of palladium acetate, 1,3-bis (diethylphosphino)propane, trifluoromethane sulfonic acid, in a weight ratio of 0.6:0.62:1 and 0.3 pyridine, in a tetrahydrofuran and methanol solution (15:1 volume ratio) were injected and the reactor pressure was maintained constant at 72 bar during the reaction by means of a continuous supply of carbon monoxide. Removal of solvent yielded an alternating propene/CO copolymer with a number average molecular weight of 733.

EXAMPLE 2

The alternating propene-CO copolymer with a number average molecular weight of 733 in Example 1 was dissolved in toluene and cyclized in the presence of a catalytic amount of p-toluene sulfonic acid by heating at reflux. The resulting polymer was analyzed by C-13 NMR which showed that 82% of the ketones in the starting polyketone were cyclized to furans (furan:ketone ratio 2.28:1) by the appearance of C-13 NMR signals (furan resonances) centered at around 107, 114, 147 and 153 ppm.

EXAMPLE 3

A system was made by blending the furanized polyketone made in Example 2 and a stoichiometric amount of toluene diamine bismaleimide (Compimide Resin TDAB, Technochemie Gmbh) at 340° F. The blend was removed from the gel plate and stored at room temperature. A solder-masked 8-ply (epoxy-glass) printed circuit board was placed on the gel plate at 340° F. and allowed to heat up to temperature. The blended system was dispensed on the board and a silicon chip was placed on top of the system and allowed to adhere to the board. The board was removed from the gel plate and allowed to cool to room temperature. The die stayed adhesively attached to the board as the system formed a crosslinked solid at room temperature. The board was re-introduced back to the hot gel plate and allowed to heat for one minute. The chip was removed from the board easily as the adhesive system reverted back to its uncrosslinked liquid state. The chip was reattached back on the board at its original location by means of the adhesive film that was still present.

EXAMPLE 4

An alternating olefin-CO copolymer (27% ethylene, 73% propylene) with a number average molecular weight of 1472 was prepared in a similar manner to Example 1 from propene and ethylene. The copolymer was dissolved in toluene and cyclized in the presence of a catalytic amount of p-toluene sulfonic acid by heating at reflux. The resulting polymer was analyzed by C-13 NMR which showed that 56% of the ketones in the starting polyketone were cyclized to furans (furan:ketone ratio 0.64:1).

EXAMPLE 5

A gel plate was set to 340° F. and the furanized polyketone made in Example 4 was dispensed onto the plate. A stoichiometric amount of TDAB was blended with the furanized polyketone until a homogeneous blend was obtained. The blend was removed from the gel plate and stored at room temperature.

EXAMPLE 6

An ICI cone and plate viscometer was set to a temperature of 175° C. and allowed to equilibrate to the set point. A small amount of blend from Example 5 was placed on the plate and allowed to come up to temperature. The cone was brought down and spun to obtain a good film between the cone and plate. This was verified by lifting the cone up to check for good film formation. Subsequently the blend was allowed to equilibrate for 90 seconds and two viscosity readings were taken while the cone was rotating at a fixed speed. The cone was lifted up and the blend retrieved from both the cone and plate. The blend was allowed to cool at room temperature to a crosslinked solid. The above sequence of events i.e. load on ICI cone and plate, measure viscosity at 175° C., remove blend, cool to room temperature, was repeated three times with the same blend. The three consecutive readings for viscosity were 3-5 poise, 3-5 poise and 3-5 poise. This experiment shows that the blend can alternate reversibly between a crosslinked state at room temperature and a low viscosity uncrosslinked liquid at 175° C.

EXAMPLE 7

An alternating propene-CO copolymer with a number average molecular weight of 1616 prepared in a similar manner to Example 1, except that 1,3-bis(di-o-methoxyphenylphosphino)propane was used in the catalyst solution instead of 1,3-bis(diethylphosphino)propane. The copolymer was dissolved in toluene and cyclized in the presence of a catalytic amount of p-toluene sulfonic acid by heating at reflux. The resulting polymer was analyzed by C-13 NMR which showed that 57% of the ketones in the starting polyketone were cyclized to furans (furan:ketone ratio 0.66:1).

EXAMPLE 8

Furanized polyketone made in Example 7 and a stoichiometric amount of TDAB along with 6.5% by weight of phenothiazine were heated to 180° C., mixed and poured in a ⅛ inch thick metal mold. The mold was cooled quickly and the resulting casting was tested for properties. The flexural modulus of the sample was found to be 628 ksi, a value similar to that of a crosslinked epoxy made with bisphenol-A epoxy cured with an anhydride hardener. The dielectric constant and dissipation factor were 3.17 and 0.013 respectively.

EXAMPLE 9

Furanized polyketone made in Example 7 was reacted with a 2:1 stoichiometric ratio of methylene dianiline bismaleimide (Compimide Resin MDAB, Technochemie Gmbh), 0.1 mole of phenothiazine/mole of MDAB and 0.015 gm of 2-ethyl hexanoic acid/gm of furanized polyketone. A differential scanning calorimetry scan was performed on the sample at a ramp rate of 20° C./min. The onset of the glass transition temperature occurred at 105° C.

EXAMPLE 10

Furanized polyketone made in Example 4 was reacted with a stoichiometric amount of TDAB and 0.1 moles of phenothiazine/mole of TDAB on a gel plate at 340° F. This sample was ground and placed in a Parr bomb with water in a 10:1 ratio (water:sample). The Parr bomb was kept at 60° C. for 20 hours and the water extract was analyzed for ions by ion chromatography. The extract contained 14 ppm acetate, <3 ppm glycolate, formate, propionate, <0.25 ppm chlorine, <1 ppm nitrate, 1.7 ppm sulfate, 4.8 ppm sodium, 0.8 ppm magnesium, 2.5 ppm calcium and 0.2 ppm ammonium ion.

We claim:

1. A thermally reworkable anisotropic conductive adhesive composition comprising:
   (a) a thermally reworkable crosslinked resin produced by reacting at least one dienophile having a functionality greater than one and at least one 2,5-dialkyl substituted furan-containing polymer, and
   (b) at least one electrically conductive material present in an effective amount to provide a conducting medium in only one direction.

2. The thermally reworkable anisotropic conductive adhesive composition of claim 1 wherein the crosslinked resin is reworkable at a temperature within the range of from about 100° C. to about 250° C.

3. The thermally reworkable anisotropic conductive adhesive composition of claim 1 wherein the electrically conductive material is present in an amount up to about 60% by volume of the anisotropic conductive adhesive composition.

4. The thermally reworkable anisotropic conductive adhesive composition of claim 1 wherein the electrically conductive material is present in an amount from about 5 to about 40% by volume of the anisotropic conductive adhesive composition.

5. The thermally reworkable anisotropic conductive adhesive composition of claim 3 wherein the dienophile is an alkyne having electron withdrawing groups attached to both sides of an ethyne moiety.

6. The thermally reworkable anisotropic conductive adhesive composition of claim 5 wherein the dienophile is selected from the group consisting of compounds containing but-2-ene-1,4-dione moieties in 5-membered rings, and compounds containing but-2-ene-1,4-dione moieties in 6-membered rings.

7. The thermally reworkable anisotropic conductive adhesive composition of claim 3 wherein the dienophile is a cyclic derivative of maleic anhydride.

8. The thermally reworkable anisotropic conductive adhesive composition of claim 3 wherein said thermally reworkable resin further comprises a residue of a cross-linking agent selected from the group consisting of, bismaleimido-capped poly(alkylene oxide)s, bis-maleimido-capped polysiloxanes, bismaleimides of hydrazine, 2,4-diaminotoluene, hexamethylenediamine, dodecamethylenediamine, and substituted and unsubstituted diamines of the formula:

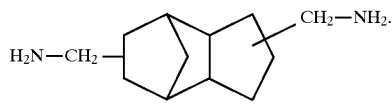

9. The thermally reworkable anisotropic conductive adhesive composition of claim 3 wherein the 2,5-dialkyl substituted furan-containing polymer is produced by reacting carbon monoxide with at least one olefinically unsaturated compound.

10. The thermally reworkable anisotropic conductive adhesive composition of claim 9 wherein the olefinically unsaturated compound is an aliphatic α-olefin.

11. The thermally reworkable anisotropic conductive adhesive composition of claim 10 wherein the α-olefin is propene.

12. The thermally reworkable anisotropic conductive adhesive composition of claim 3 wherein the polymer from which it is produced has a number average molecular weight in the range of 500–30,000.

13. The thermally reworkable anisotropic conductive adhesive composition of claim 4 wherein the 2,5-dialkyl furan-containing polymer has a furan groups to ketone groups ratio of from about 1:16 to about 4:1.

14. The thermally reworkable anisotropic conductive adhesive composition of claim 4 wherein the 2,5-dialkyl substituted furan groups in the 2,5-dialkyl substituted furan-containing polymer and the dienophiles are combined in a molar ratio of from about 10:1 to about 1:5.

15. The thermally reworkable anisotropic conductive adhesive composition of claim 3 wherein the thermally reworkable crosslinked resin comprises moieties of a 2,5-dialkyl substituted furan and moieties of a dienophile.

16. The thermally reworkable anisotropic conductive adhesive composition of claim 3 further comprising (c) a free radical inhibitor and/or an ion scavenger.

17. A process for attaching a component to a substrate comprising:
(a) providing a substrate;
(b) dispensing on a portion of said substrate a thermally reworkable anisotropic conductive adhesive composition comprising
(i) a thermally reworkable crosslinked resin produced by reacting at least one dienophile having a functionality of greater than one and at least one 2,5-dialkyl substituted furan-containing polymer, and (ii) up to about 60% by volume of the anisotropic conductive adhesive composition of at least one electrically conductive material, at a temperature which is sufficiently high to convert the anisotropic conductive adhesive composition into a liquid thereby producing an adhesive-attached substrate, and
(c) attaching a component having conductive pads on the surface of the thermally reworkable anisotropic conductive adhesive composition dispensed on the substrate while the adhesive is a liquid under conditions effective to provide electrically conductive paths between the conductive pads on the component and the substrate while maintaining an electrically insulating property in the transverse direction, thereby bonding said component to said substrate, and providing an assembly.

18. The process of claim 17 wherein the crosslinked resin is heated at a temperature within the range of from about 100° C. to about 250° C.

19. The process of claim 17 further comprising (d) heating the assembly at a temperature within the range of 70° C. to 200° C. for a period of up to 4 hours.

20. The process of claim 17 further comprising (d) heating the assembly at a temperature within the range of 150° C. to 300° C. for a period of up to 4 hours.

21. The process of claim 18 wherein the dienophile is an alkyne having electron withdrawing groups attached to both sides of an ethyne moiety.

22. The process of claim 21 wherein the 2,5-dialkyl substituted furan-containing polymer is produced by reacting carbon monoxide with at least one olefinically unsaturated compound.

23. The process of claim 22 wherein the olefinically unsaturated compound is an aliphatic α-olefin.

24. The process of claim 17 further comprising the steps of:
(d) heating the thermally reworkable conductive adhesive composition of the assembly at a temperature which is sufficiently high to convert the thermally reworkable conductive adhesive composition into a liquid thereby providing a liquid adhesive, and
(e) removing the component from the liquid adhesive.

25. The process of claim 24 further comprising the steps of:
(f) removing the liquid adhesive from the substrate;
(g) dispensing a fresh thermally reworkable conductive adhesive composition comprising
(i) a thermally reworkable crosslinked resin produced by reacting a dienophile having a functionality greater than one and a 2,5-dialkyl substituted furan-containing polymer, and
(ii) up to about 60% by volume of the anisotropic conductive adhesive composition of at least one electrically conductive material, at a temperature which is sufficiently high to convert the anisotropic conductive adhesive composition into a liquid thereby producing an adhesive-attached substrate, and
(h) providing another component having conductive pads on the surface of the thermally reworkable anisotropic conductive adhesive composition dispensed on the substrate while the adhesive composition is a liquid under conditions effective to provide electrically conductive paths between the conductive pads on the component and the substrate while maintaining an electrically insulating property in the transverse direction, thereby bonding the component to the substrate, and providing an assembly.

26. The process of claim 25 wherein the crosslinked resin is heated at a temperature within the range of from about 100° C. to about 250° C.

27. The process of claim 26 further comprising (d) heating the assembly at a temperature within the range of 70° C. to 200° C. for a period of up to 4 hours.

28. The process of claim 26 further comprising (d) heating the assembly at a temperature within the range of 150° C. to 300° C. for a period of up to 4 hours.

29. The process of claim 25 wherein the dienophile is an alkyne having electron withdrawing groups attached to both sides of an ethyne moiety.

30. The process of claim 25 wherein the 2,5-dialkyl substituted furan-containing polymer is produced by reacting carbon monoxide with at least one olefinically unsaturated compound.

31. The process of claim 30 wherein the olefinically unsaturated compound is an aliphatic α-olefin.

* * * * *